(12) United States Patent
Hayashiguchi et al.

(10) Patent No.: US 9,461,533 B2
(45) Date of Patent: Oct. 4, 2016

(54) ELECTRONIC CIRCUIT

(71) Applicant: ROHM CO., LTD., Kyoto-shi, Kyoto (JP)

(72) Inventors: Masashi Hayashiguchi, Kyoto (JP); Mineo Miura, Kyoto (JP); Kazuhide Ino, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/439,184

(22) PCT Filed: Oct. 30, 2013

(86) PCT No.: PCT/JP2013/079415
§ 371 (c)(1),
(2) Date: Apr. 28, 2015

(87) PCT Pub. No.: WO2014/069525
PCT Pub. Date: May 8, 2014

(65) Prior Publication Data
US 2015/0311779 A1 Oct. 29, 2015

(30) Foreign Application Priority Data
Oct. 31, 2012 (JP) ................................. 2012-240564

(51) Int. Cl.
*H02M 1/32* (2007.01)
*H03K 17/082* (2006.01)
(Continued)

(52) U.S. Cl.
CPC ............... *H02M 1/32* (2013.01); *H02M 7/217* (2013.01); *H03K 17/04123* (2013.01);
(Continued)

(58) Field of Classification Search
CPC ........... H02M 1/32; H02M 2001/325; H02M 2001/327; H02M 1/38; H02M 7/5387; H02M 7/53871; H02H 7/122; H02H 7/1225; H02H 7/1227; Y02B 70/1483
See application file for complete search history.

(56) References Cited

U.S. PATENT DOCUMENTS 4,636,929 A * 1/1987 Nakamura ......... G01R 19/1658
363/132
5,642,247 A * 6/1997 Giordano ................. H02P 7/04
318/434

(Continued)

FOREIGN PATENT DOCUMENTS

JP 2005-137072 5/2005
JP 2007-312504 11/2007
(Continued)

OTHER PUBLICATIONS

International Search Report, Jan. 28, 2014; PCT/JP2013/079415.
(Continued)

*Primary Examiner* — Gary L Laxton
(74) *Attorney, Agent, or Firm* — Hamre, Schumann, Mueller & Larson, P.C.

(57) ABSTRACT

When an overcurrent is detected by an overcurrent detecting circuit (36), a first switch circuit (32) selects a second input terminal (b) and connects an output terminal (c) to the second input terminal (b), with the result that the output terminal (c) of the first switch circuit (32) is put into a high-impedance state. The second switch circuit (34) selects a second output terminal (f) and connects an input terminal (d) to the second output terminal (f), with the result that the input terminal (d) of the second switch circuit (34) is grounded. That is, the gate of a first MOSFET (21) is grounded via a current interrupting resistor (35). The resistance value of the current interrupting resistor (35) is set so that, at the time of a current interruption, a time interval from a time when the gate-source voltage or gate-emitter voltage of the switching device lowers to such a voltage that the temperature characteristics of the on-resistance of the switching device become negative to a time when the drain current or collector current of the switching device reaches 2% of the saturation current thereof is 500 [nsec] or less.

7 Claims, 7 Drawing Sheets

(51) Int. Cl.
  H03K 17/12    (2006.01)
  H03K 17/16    (2006.01)
  H02M 7/217    (2006.01)
  H03K 17/0412  (2006.01)
  H03K 17/0812  (2006.01)
  H02H 7/122    (2006.01)
  H02M 7/5387   (2007.01)
  H02M 1/088    (2006.01)

(52) U.S. Cl.
  CPC ... *H03K 17/0822* (2013.01); *H03K 17/08122* (2013.01); *H03K 17/122* (2013.01); *H03K 17/163* (2013.01); *H02M 1/088* (2013.01); *H03K 2217/0045* (2013.01)

(56) References Cited

U.S. PATENT DOCUMENTS

| | | | | |
|---|---|---|---|---|
| 5,936,387 A * | 8/1999 | Tabata | ............... | H02M 7/538 323/225 |
| 8,279,644 B2 * | 10/2012 | Zhang | ............... | G05F 1/67 363/131 |
| 2010/0253250 A1 * | 10/2010 | Marvelly | ............... | H02P 6/085 318/3 |
| 2013/0070504 A1 * | 3/2013 | Xu | ............... | H02M 7/5388 363/132 |
| 2013/0088096 A1 | 4/2013 | Hashimoto et al. | | |
| 2013/0200929 A1 | 8/2013 | Sawada et al. | | |

FOREIGN PATENT DOCUMENTS

| | | |
|---|---|---|
| WO | 2011/129263 A1 | 10/2011 |
| WO | 2012/018073 | 2/2012 |

OTHER PUBLICATIONS

Scofield et al. "Electrical and Thermal Performance of 1200 V, 100 A, 200 Degree C 41-1-SiC MOSFET-based Power Switch Modules". Materials Science Forum, Vols. 645-648, pp. 1119-1122, Apr. 29, 2010.

Sturman. "Design of High-Voltage, High-Power, Solid-State Remote Power Controllers for Aerospace Applications". European Space Agency-Special Publication, ESA Scientific & Technical Publications, Noordwijk, NL, pp. 207-216, Jun. 24, 1985.

Extended European Search Report issued in connection with corresponding European Patent Application No. 13850475.8 on Apr. 26, 2016.

* cited by examiner

ELECTRONIC CIRCUIT

TECHNICAL FIELD

The present invention relates to an electronic circuit such as an inverter circuit and a converter circuit.

BACKGROUND ART

A switching device to be used in an electronic circuit such as an inverter circuit and a converter circuit generally consists of a plurality of switching elements (chips) connected in parallel to increase the current capacity. As switching elements, in addition to Si switching elements chiefly made of Si (silicon), SiC switching elements chiefly made of SiC (silicon carbide) have been developed. SiC switching elements include SiC-MOSFETs (Metal-Oxide-Semiconductor Field Effect Transistors), SiC-bipolar transistors, SiC-JFETs (Junction Field Effect Transistors), and SiC-IGBTs (Insulated Gate Bipolar Transistors), etc.

CITATION LIST

Patent Literature

PTL 1: Japanese Patent Application Publication No. 2005-137072

SUMMARY OF INVENTION

Technical Problem

In an electronic circuit using a SiC switching device, if a short-circuit that causes a power supply voltage to be directly applied to the SiC switching device occurs, a short-circuit current may flow into the SiC switching device. Therefore, in such a case, by grounding the gate terminal of the SiC switching device, the short-circuit current is interrupted. At this time, if the short-circuit current interrupting speed is increased, a large current is flowing in the SiC switching device, so that a large surge voltage may be generated and the SiC switching device may be broken. Therefore, the short-circuit current interrupting speed needs to be made low. However, in the case where the short-circuit current interrupting speed is made low, the SiC switching device may be broken due to thermal runaway.

This is described by using a SiC switching device developed by the applicant of the present invention by way of example. The SiC switching device developed by the applicant of the present invention consists of a plurality of SiC-MOSFETs connected in parallel. Specifically, a plurality of semiconductor chips of SiC-MOSFETs are connected in parallel. FIG. 5 shows an example of the temperature characteristics of the on-resistance of the SiC switching device developed by the applicant of the present invention. FIG. 5 shows the temperature characteristics of the on-resistance of the SiC switching device in a case where the gate-source voltage Vgs is changed from 9 [V] to 22 [V] in increments of 0.5 [V].

As shown in FIG. 5, the temperature characteristics of the on-resistance of the SiC switching device change according to the gate-source voltage Vgs of the SiC switching device. In the example shown in FIG. 5, when the gate-source voltage Vgs is larger than 10 [V], in the high-temperature region on the right side in FIG. 5, the on-resistance of the SiC switching device increases as the temperature rises (the temperature characteristics of the on-resistance are positive).

On the other hand, when the gate-source voltage Vgs is not more than 10 [V], in the high-temperature region on the right side in FIG. 5, the on-resistance of the SiC switching device becomes smaller as the temperature rises (the temperature characteristics of the on-resistance are negative). The high-temperature region is, for example, a region of 125° C. or more and 150° C. or less. The high-temperature region may be, for example, a region around 150° C. At the time of a current interruption, for example, at 150° C., there is a question whether the temperature characteristics of the on-resistance are positive or negative. In FIG. 6, at 150° C., when the gate-source voltage Vgs is not more than 10 [V], the temperature characteristics of the on-resistance are negative.

In normal operation, when the SiC switching device is in an ON state, the gate-source voltage Vgs of the SiC switching device is approximately 18 [V], so that the on-resistance of the SiC switching device increases as the temperature rises. At the time of a short-circuit current interruption, the gate-source voltage Vgs of the SiC switching device lowers. Then, when the gate-source voltage Vgs becomes 10 [V] or less, the temperature characteristics of the on-resistance of the SiC switching device become negative, so that the higher the temperature, the smaller the on-resistance of the SiC switching device.

Among the plurality of SiC-MOSFETs constituting the SiC switching device, particularly when a plurality of SiC semiconductor chips are connected in parallel, the characteristics vary for each of the semiconductor chips. In addition, due to variation in temperature, among the plurality of SiC-MOSFETs, the on-resistance varies for each of the semiconductor chips. Therefore, a current intensively flows in the SiC-MOSFET with the lowest on-resistance (the SiC-MOSFET whose temperature is the highest) among the plurality of SiC-MOSFETs in the SiC switching device. As a result, the SiC switching device may be broken.

An object of the present invention is to provide an electronic circuit capable of preventing a switching device from being broken at the time of a short-circuit.

Solution to Problem

An electronic circuit of the present invention includes a switching device including a plurality of switching elements that are connected in parallel and chiefly made of SiC, an overcurrent detecting circuit to detect that an overcurrent is flowing in the switching device, and an overcurrent protecting circuit to interrupt a current flowing in the switching device when an overcurrent is detected by the overcurrent detecting circuit. The overcurrent protecting circuit is arranged such that, at the time of a current interruption, a time interval from a time when the gate-source voltage or gate-emitter voltage of the switching device lowers to such a voltage that the temperature characteristics of the on-resistance of the switching device become negative to a time when the drain current or collector current of the switching device reaches 2% of the saturation current thereof is 500 [nsec] or less.

In the present invention, a time interval from a time when the gate-source voltage or gate-emitter voltage of the switching device lowers to such a voltage that the temperature characteristics of the on-resistance of the switching device become negative to a time when the drain current or collector current of the switching device reaches 2% of the saturation current thereof is set to 500 [nsec] or less, so that the switching device can be prevented from being broken due to thermal runaway.

In addition, even when the time interval is set to 500 [nsec] or less, it takes time until the gate-source voltage or gate-emitter voltage of the switching device lowers to such a value that the temperature characteristics of the on-resistance of the switching device become negative after starting a current interrupting operation, so that the current interrupting speed does not becomes excessively high. Therefore, the surge voltage can also be kept low.

In a preferred embodiment of the present invention, the overcurrent protecting circuit is arranged such that, at the time of a current interruption, a time interval from a time when a current interrupting operation is started to a point at which the gate-source voltage or gate-emitter voltage of the switching device lowers to such a voltage that the temperature characteristics of the on-resistance of the switching device become negative is 100 [nsec] or more, and a time interval from the point to a time when the drain current or collector current of the switching device reaches 2% of the saturation current thereof is 500 [nsec] or less.

With this arrangement, the switching device can be prevented from being broken due to thermal runaway, and the surge voltage can also be kept low.

In a preferred embodiment of the present invention, the overcurrent protecting circuit includes a current interrupting resistor and a circuit that grounds the gate terminal of the switching device via the current interrupting resistor when an overcurrent is detected by the overcurrent detecting circuit. In addition, the resistance value of the current interrupting resistor is set so that a time interval from a time when the gate-source voltage or gate-emitter voltage of the switching device lowers to such a voltage that the temperature characteristics of the on-resistance of the switching device become negative to a time when the drain current or collector current of the switching device reaches 2% of the saturation current thereof is 500 [nsec] or less.

In a preferred embodiment of the present invention, the overcurrent protecting circuit includes a current interrupting resistor and a circuit that grounds the gate terminal of the switching device via the current interrupting resistor when an overcurrent is detected by the overcurrent detecting circuit. The resistance value of the current interrupting resistor is set so that a time interval from a time when a current interrupting operation is started to a point at which the gate-source voltage or gate-emitter voltage of the switching device lowers to such a voltage that the temperature characteristics of the on-resistance of the switching device become negative is 100 [nsec] or more, and a time interval from the point to a time when the drain current or collector current of the switching device reaches 2% of the saturation current thereof is 500 [nsec] or less.

In a preferred embodiment of the present invention, the overcurrent protecting circuit includes a first current interrupting resistor, a second current interrupting resistor whose resistance value is larger than the resistance value of the first current interrupting resistor, and a circuit that grounds the gate terminal of the switching device via the second current interrupting resistor when an overcurrent is detected by the overcurrent detecting circuit, and grounds the gate terminal of the switching device via the first current interrupting resistor when the gate-source voltage or gate-emitter voltage of the switching device lowers to such a voltage that the temperature characteristics of the on-resistance of the switching device become negative. The resistance value of the first current interrupting resistor is set so that a time interval from a time when the gate-source voltage or gate-emitter voltage of the switching device lowers to such a voltage that the temperature characteristics of the on-resistance of the switching device become negative to a time when the drain current or collector current of the switching device reaches 2% of the saturation current thereof is 500 [nsec] or less.

In a preferred embodiment of the present invention, the overcurrent protecting circuit includes a first current interrupting resistor, a second current interrupting resistor whose resistance value is larger than the resistance value of the first current interrupting resistor, and a circuit that grounds the gate terminal of the switching device via the second current interrupting resistor when an overcurrent is detected by the overcurrent detecting circuit, and grounds the gate terminal of the switching device via the first current interrupting resistor when the gate-source voltage or gate-emitter voltage lowers to such a voltage that the temperature characteristics of the on-resistance of the switching device become negative. The resistance value of the second current interrupting resistor is set so that a time interval from a time when a current interrupting operation is started to a point at which the gate-source voltage or gate-emitter voltage of the switching device lowers to such a voltage that the temperature characteristics of the on-resistance of the switching device become negative is 100 [nsec] or more. In addition, the resistance value of the first current interrupting resistor is set so that a time interval from a point at which the gate-source voltage or gate-emitter voltage of the switching device lowers to such a voltage that the temperature characteristics of the on-resistance of the switching device become negative to a time when the drain current or collector current of the switching device reaches 2% of the saturation current thereof is 500 [nsec] or less.

In a preferred embodiment of the present invention, the switching elements are ones arbitrarily selected from among MOSFETs, bipolar transistors, JFETs, and IGBTs that are chiefly made of SiC.

The aforementioned or other objects, features, and effects of the present invention will be clarified by the following description of embodiments with reference to the accompanying drawings.

DESCRIPTION OF EMBODIMENTS

Hereinafter, preferred embodiments of the present invention are described in detail with reference to the accompanying drawings.

Figure 1:
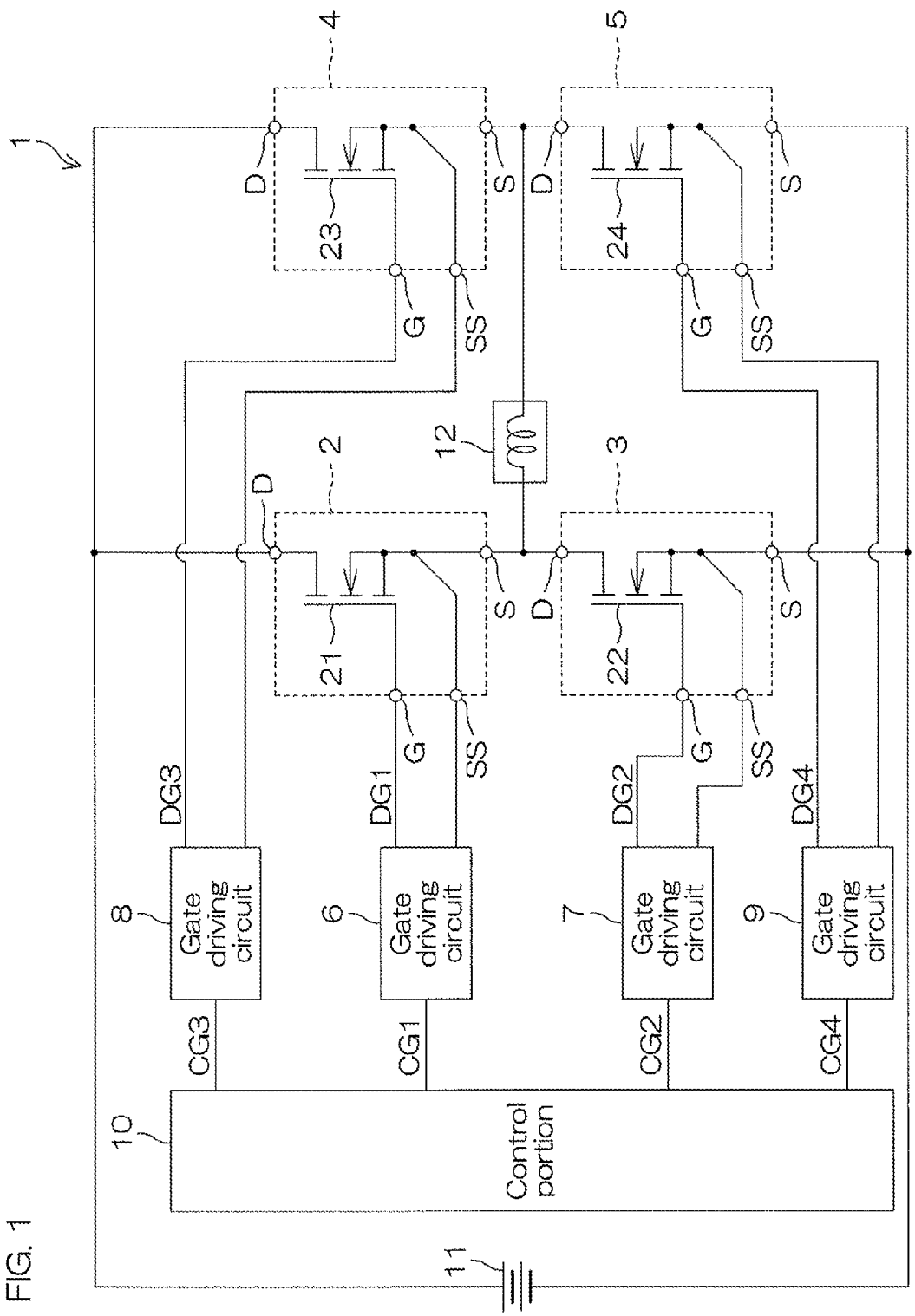
FIG. 1 is an electric circuit diagram showing an inverter circuit according to a preferred embodiment of the present invention.

FIG. 1 is an electric circuit diagram showing an inverter circuit according to a preferred embodiment of the present invention.

The inverter circuit 1 includes first to fourth modules (switching devices) 2 to 5, first to fourth gate driving circuits 6 to 9, and a control portion 10.

Figure 2:
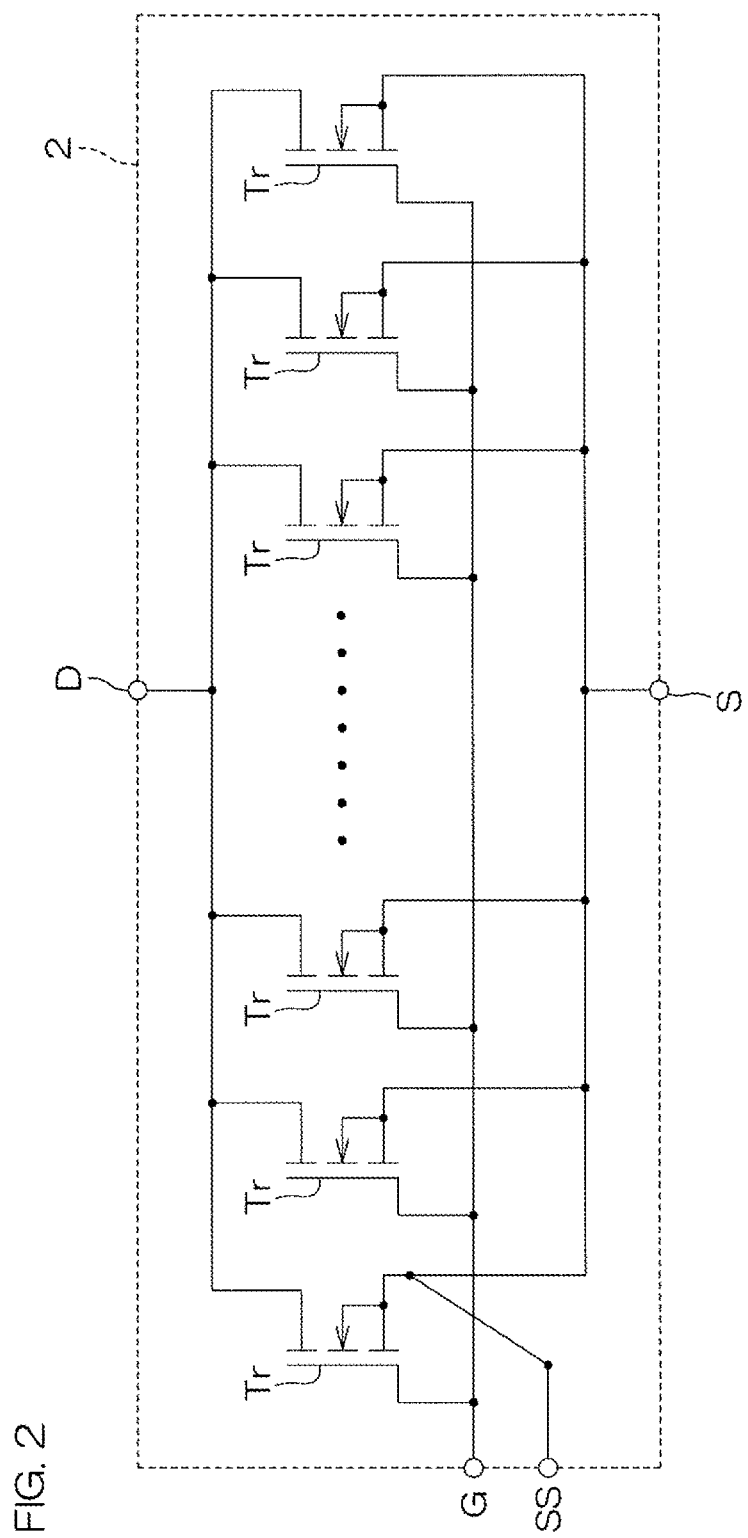
FIG. 2 is a pictorial plan view showing an electrical arrangement of a module of FIG. 1.

FIG. 2 is an electric circuit diagram showing an electrical arrangement of the first module 2.

The first module 2 includes a plurality of switching elements Tr (semiconductor chips). The switching elements Tr consist of N-channel type MOSFETs. In particular, in the present preferred embodiment, the switching elements are SiC-MOSFETs chiefly made of SiC (silicon carbide). The first module 2 also includes a drain terminal D, a source terminal S, a gate terminal G, and a source sense terminal SS. The plurality of switching elements Tr (semiconductor chips) are connected in parallel between the drain terminal D and the source terminal S. The SiC switching elements such as SiC-MOSFETs are difficult to be increased in chip size in comparison with Si switching elements, so that in a module consisting of a plurality of SiC switching elements, the number of switching elements connected in parallel (the number of semiconductor chips connected in parallel) become larger in a module consisting of a plurality of Si switching elements in many cases.

The drains of the plurality of switching elements Tr are connected to the drain terminal D. The sources of the plurality of switching elements Tr are connected to the source terminal S. The gates of the plurality of switching elements Tr are connected to the gate terminal G. The source (current detecting portion) of one switching element Tr is also connected to the source sense terminal SS. The second, third, and fourth modules 3 to 5 are the same in the arrangement as that of the first module 2.

In FIG. 1, the parallel circuit of the plurality of switching elements Tr inside the first module 2 is simply represented by one MOSFET 21 (hereinafter, referred to as "first MOSFET 21"). Similarly, the parallel circuit of the plurality of switching elements Tr inside the second module 3 is simply represented by one MOSFET 22 (hereinafter, referred to as "second MOSFET 22"). Similarly, the parallel circuit of the plurality of switching elements Tr inside the third module 4 is simply represented by one MOSFET 23 (hereinafter, referred to as "third MOSFET 23"). Similarly, the parallel circuit of the plurality of switching elements Tr inside the fourth module 5 is simply represented by one MOSFET 24 (hereinafter, referred to as "fourth MOSFET 24").

The drain terminal D of the first module 2 (the drain of the first MOSFET 21) is connected to the positive terminal of the power supply 11. The source terminal S of the first module 2 (the source of the first MOSFET 21) is connected to the drain terminal D of the second module 3 (the drain of the second MOSFET 22). The gate terminal G of the first module 2 (the gate of the first MOSFET 21) and the source sense terminal SS of the first module 2 (the source of the first MOSFET 21) are connected to the first gate driving circuit 6.

The source terminal S of the second module 3 (the source of the second MOSFET 22) is connected to the negative terminal of the power supply 11. The gate terminal G of the second module 3 (the gate of the second MOSFET 22) and the source sense terminal SS of the second module 3 (the source of the second MOSFET 22) are connected to the second gate driving circuit 7.

The drain terminal D of the third module 4 (the drain of the third MOSFET 23) is connected to the positive terminal of the power supply 11. The source terminal S of the third module 4 (the source of the third MOSFET 23) is connected to the drain terminal D of the fourth module 5 (the drain of the fourth MOSFET 24). The gate terminal G of the third module 4 (the gate of the third MOSFET 23) and the source sense terminal SS of the third module 4 (the source of the third MOSFET 23) are connected to the third gate driving circuit 8.

The source terminal S of the fourth module 5 (the source of the fourth MOSFET 24) is connected to the negative terminal of the power supply 11. The gate terminal G of the fourth module 5 (the gate of the fourth MOSFET 24) and the source sense terminal SS of the fourth module 5 (the source of the fourth MOSFET 24) are connected to the fourth gate driving circuit 9. Between the connection point between the first module 2 and the second module 3 and the connection point between the third module 4 and the fourth module 5, a load 12 is connected.

The control portion 10 consists of a microcomputer including a CPU and a memory (ROM, RAM, etc.) storing programs, etc., of the CPU. The control portion 10 generates a first gate control signal CG1 for the first MOSFET 21, a second gate control signal CG2 for the second MOSFET 22, a third gate control signal CG3 for the third MOSFET 23, and a fourth gate control signal CG4 for the fourth MOSFET 24, and provides these signals to the first, second, third, and fourth gate driving circuits 6, 7, 8, and 9, respectively.

The respective gate driving circuits 6, 7, 8, and 9 generate gate driving signals DG1, DG2, DG3, and DG4 for the first MOSFET 21, the second MOSFET 22, the third MOSFET 23, and the fourth MOSFET 24 based on the gate control signals CG1, CG2, CG3, and CG4 provided from the control portion 10 and output these, respectively. Accordingly, driving of the first to fourth MOSFETs 21, 22, 23, and 24 is controlled.

In such an inverter circuit 1, for example, the first MOSFET 21 and the fourth MOSFET 24 are turned on. Thereafter, according to turning-off of these MOSFETs 21 and 24, all MOSFETS 21 to 24 are brought into an OFF state. After a predetermined dead time elapses, the second MOSFET 22 and the third MOSFET 23 are turned on in turn. Thereafter, according to turning-off of these MOSFETs 22 and 23, all MOSFETs 21 to 24 are brought into an OFF state. After a predetermined dead time elapses, the first MOSFET 21 and the fourth MOSFET 24 are turned on again. By repeating these operations, the load 12 is AC-driven.

The respective gate driving circuits 6, 7, 8, and 9 have an overcurrent protective function to protect the MOSFETs 21, 22, 23, and 24 in a case where a short-circuit, etc., that causes a power source voltage to be directly applied to the corresponding MOSFETs 21, 22, 23, and 24 occurs. The case where a short-circuit that causes a power source voltage to be directly applied to the MOSFETs 21, 22, 23, and 24 occurs includes, for example, a case where the load 12 is short-circuited, a case where the two MOSFETs (21 and 22, 23 and 24) connected in series between the positive terminal and the negative terminal of the power supply 11 are simultaneously turned on, and a case where a short-circuit fault occurs in either one of the two MOSFETs (21 and 22, 23 and 24) connected in series between the positive terminal and the negative terminal of the power supply 11. The respective gate driving circuits 6, 7, 8, and 9 have the same arrangement, and therefore, the overcurrent protective function of the first gate driving circuit 6 is described in detail, hereinafter.

Figure 3:
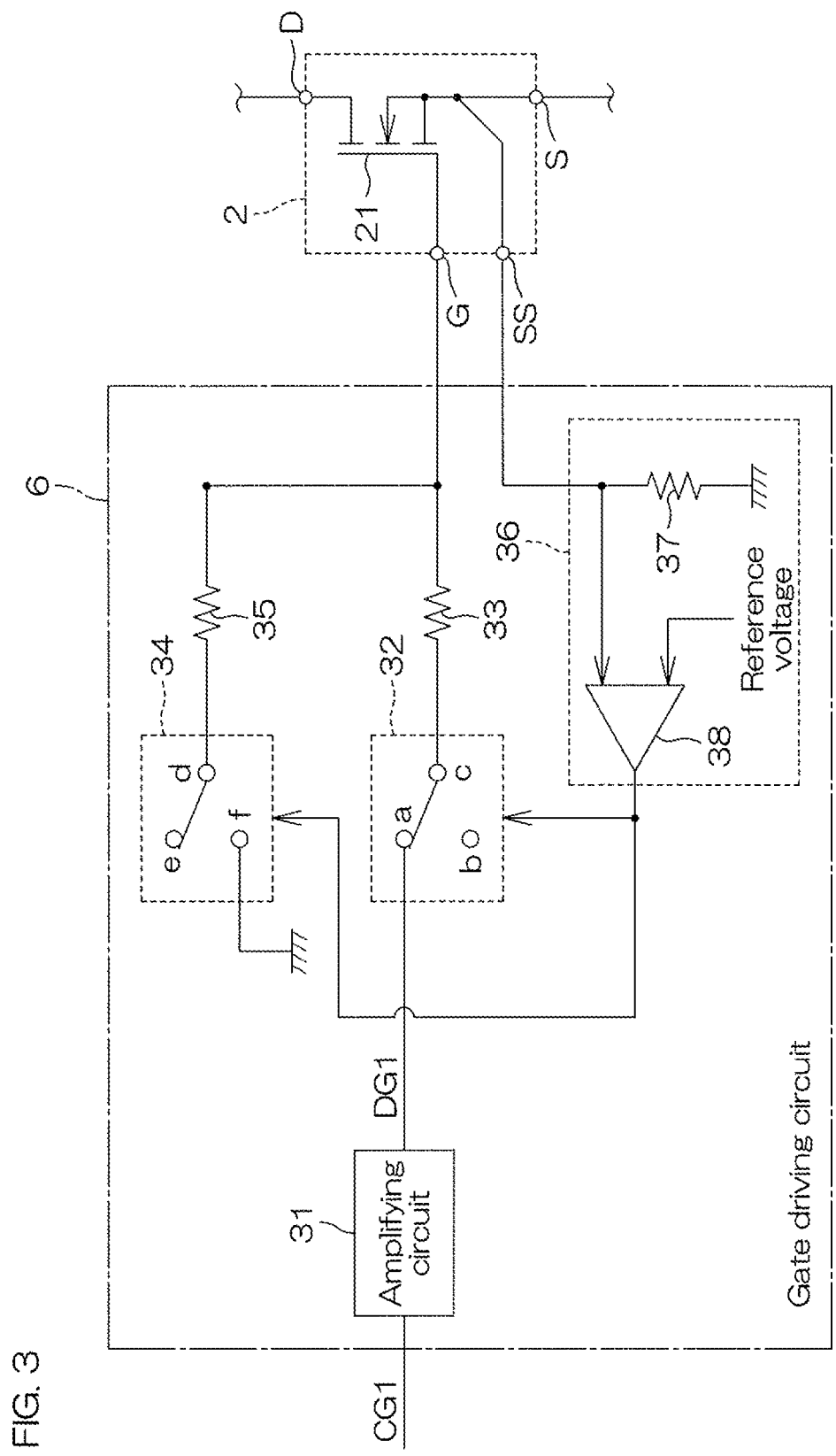
FIG. 3 is an electric circuit diagram showing an electrical arrangement of a gate driving circuit.

FIG. 3 is an electric circuit diagram showing the arrangement of the first gate driving circuit.

The first gate driving circuit 6 includes an amplifying circuit 31, a first switch circuit 32, a gate resistor 33, a second switch circuit 34, a current interrupting resistor 35, and an overcurrent detecting circuit 36.

To the input terminal of the amplifying circuit 31, the gate control signal CG1 from the control portion 10 is input. The amplifying circuit 31 amplifies the gate control signal CG1 to generate the gate driving signal DG1. The output terminal of the amplifying circuit 31 is connected to one input terminal (first input terminal) a of the first switch circuit 32. The first switch circuit 32 has two input terminals a and b and one output terminal c, and selects either one input terminal a or b and connects it to the output terminal c. The other input terminal (second input terminal) b of the first switch circuit 32 is in an open state. The output terminal c of the first switch circuit 32 is connected to the gate terminal G of the first module 2 via the gate resistor 33. The first switch circuit 32 is controlled by an output of the overcurrent detecting circuit 36.

The second switch circuit 34 has one input terminal d and two output terminals e and f, and selects either one output terminal e or f and connects the input terminal d to the selected output terminal. The input terminal d is connected to the connection point between the gate resistor 33 and the gate terminal G of the first module 2 via the current interrupting resistor 35. One output terminal (first output terminal) e is in an open state. The other output terminal (second output terminal) f is grounded. The second switch circuit 34 is controlled by an output of the overcurrent detecting circuit 36. The resistance value of the gate resistor 33 is represented by r1, and the resistance value of the current interrupting resistor 35 is represented by r2. As described later, r2 is set to a value larger than r1.

The overcurrent detecting circuit 36 includes a current detecting resistor 37 and a comparison circuit 38. One end of the current detecting resistor 37 is connected to the source sense terminal SS of the first module 2, and the other end of the current detecting resistor 37 is grounded. The voltage between the terminals (voltage drop amount) of the current detecting resistor 37 corresponds to the magnitude of the current flowing in the first MOSFET 21. The voltage between the terminals of the current detecting resistor 37 is provided to the comparison circuit 38. The comparison circuit 38 judges whether or not an overcurrent state has occurred by comparing the voltage between terminals of the current detecting resistor 37 and a reference voltage, and outputs a judgment signal showing the results of the judgment. Specifically, the comparison circuit 38 judges that an overcurrent state has occurred (detects an overcurrent) when the voltage between the terminals of the current detecting resistor 37 is larger than the reference voltage.

In a state where no overcurrent is detected by the overcurrent detecting circuit 36 (normal state), the second switch circuit 34 selects the first output terminal e and connects the input terminal d to the first output terminal e. Accordingly, the input terminal d of the second switch circuit 34 is put into a high-impedance state. The first switch circuit 32 selects the first input terminal a and connects the first input terminal a to the output terminal c. Accordingly, the gate driving signal DG1 generated by the amplifying circuit 31 is provided to the gate of the first MOSFET 21 via the gate resistor 33. By this gate driving signal DG1, driving of the first MOSFET 21 is controlled.

When an overcurrent is detected by the overcurrent detecting circuit 36, the first switch circuit 32 selects the second input terminal b and connects the output terminal c to the second input terminal b. Accordingly, the output terminal c of the first switch circuit 32 is put into a high-impedance state. The second switch circuit 34 selects the second output terminal f and connects the input terminal d to the second output terminal f. Accordingly, the input terminal d of the second switch circuit 34 is grounded.

That is, the gate of the first MOSFET 21 is grounded via the current interrupting resistor 35. As a result, the gate-source voltage Vgs of the first MOSFET 21 is lowered, and the drain current (short-circuit current) flowing in the first MOSFET 21 is interrupted. The short-circuit current interrupting speed changes according to the resistance value r2 of the current interrupting resistor 35. The larger the resistance value r2 of the current interrupting resistor 35, the lower the short-circuit current interrupting speed. The resistance value r2 of the current interrupting resistor 35 is larger than the resistance value r1 of the gate resistor 33. In the present preferred embodiment, the resistance value r1 of the gate resistor 33 is, for example, 3.9 [Ω], and the resistance value r2 of the current interrupting resistor 35 is, for example, 33 [Ω].

When the short-circuit current interrupting speed is increased, since a large current flows in the first MOSFET 21, a large surge voltage may be generated and the first MOSFET 21 may be broken. Therefore, the short-circuit current interrupting speed needs to be made low. Therefore, when detecting an overcurrent, the gate of the first MOSFET 21 is grounded via the current interrupting resistor 35 having the resistance value r2 larger than the resistance value r1 of the gate resistor 33.

Figure 5:
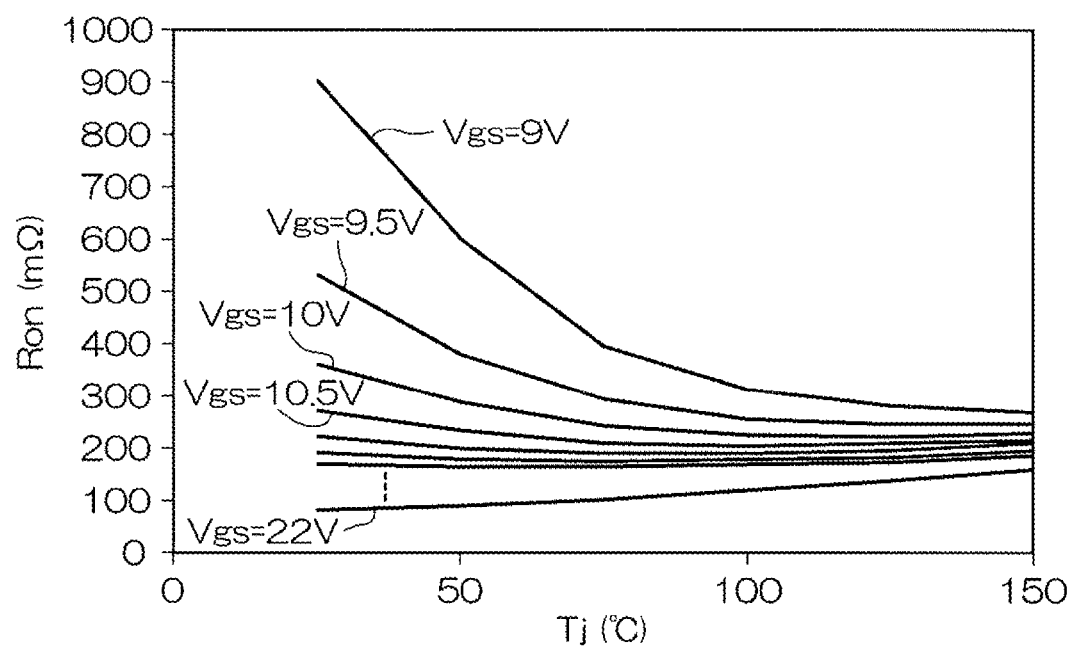
FIG. 5 is a graph showing the temperature characteristics of the on-resistance of the module shown in FIG. 2.

However, when the short-circuit current interrupting speed is made low, due to thermal runaway, the first MOSFET 21 may be broken. That is, the temperature characteristics of the on-resistance of the first MOSFET 21 change according to the gate-source voltage Vgs of the first MOSFET 21 as shown in FIG. 5. FIG. 5 shows the temperature characteristics of the on-resistance of the first MOSFET 21 when the gate-source voltage Vgs are changed from 9 [V] to 22 [V] in increments of 0.5 [V].

In the example of FIG. 5, when the gate-source voltage Vgs is larger than 10 [V], in the high-temperature region on the right side in FIG. 5, the on-resistance of the first MOSFET increases as the temperature rises (the temperature characteristics of the on-resistance are positive). For example, at 150° C., when the gate-source voltage Vgs is larger than 10 [V], the temperature characteristics of the on-resistance are positive.

On the other hand, when the gate-source voltage Vgs is not more than 10 [V], in the high-temperature region on the right side in FIG. 5, the on-resistance of the first MOSFET 21 becomes smaller as the temperature rises (the temperature characteristics of the on-resistance are negative). For example, at 150° C., when the gate-source voltage Vgs is not more than 10 [V], the temperature characteristics of the on-resistance are negative. The high-temperature region is, for example, a region of 125° C. or more and 150° C. or less. The high-temperature region may be, for example, a region around 150° C.

In a normal state, when the first MOSFET 21 is in an ON state, the gate-source voltage Vgs of the first MOSFET 21 is approximately 18 [V], so that the on-resistance of the first MOSFET 21 increases as the temperature rises. When interrupting a current, the gate-source voltage Vgs of the first MOSFET 21 lowers. Then, when the gate-source voltage Vgs becomes 10 [V] or less, the temperature characteristics of the on-resistance of the first MOSFET 21 become negative, so that the on-resistance of the first MOSFET 21 becomes smaller as the temperature becomes higher.

There is variation in temperature among the plurality of switching elements Tr included in the first MOSFET 21, so that the on-resistance varies among the plurality of switching elements Tr. Therefore, a current intensively flows into the switching element Tr with the lowest on-resistance (the switching element Tr whose temperature is the highest) among the plurality of switching elements Tr included in the first MOSFET 21. As a result, the first MOSFET 21 may be broken.

Therefore, in the present preferred embodiment, the resistance value r2 of the current interrupting resistor 35 is set so that a time interval from a time when a current interrupting operation is started to a point at which the gate-source voltage Vgs lowers to such a value (10 [V] in the present preferred embodiment) that the temperature characteristics of the on-resistance of the first MOSFET 21 become negative is 100 [nsec] or more, and a time interval Tx from the point to a time when the drain current of the first MOSFET 21 becomes 2% or less of the saturation current is 500 [nsec] or less.

In the present preferred embodiment, the time interval Tx is set to 500 [nsec] or less, so that, as is understood from the experiment results described later, the first MOSFET 21 can be prevented from being broken due to thermal runaway. In addition, even when the time interval Tx is set to 500 [nsec] or less, a time interval from a time when the current interrupting operation is started to a point at which the gate-source voltage Vgs lowers to such a value that the temperature characteristics of the on-resistance of the first MOSFET 21 become negative is set to 100 [nsec] or more, and therefore, the current interrupting speed does not become excessively high. Therefore, the surge voltage can be kept low.

Figure 4:
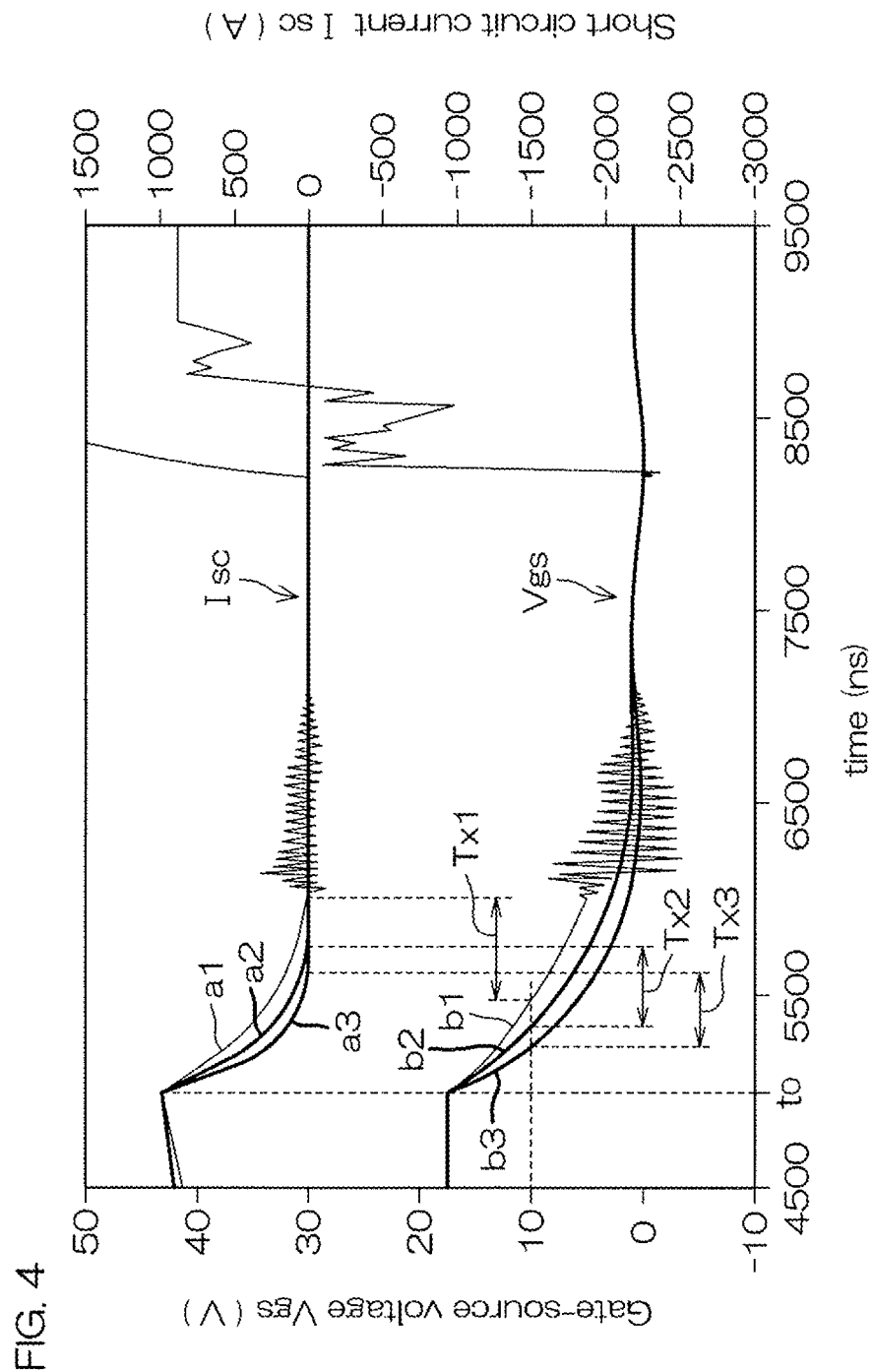
FIG. 4 is a diagram showing the results of a short-circuit test conducted on a specimen which was prepared so as to have the same structure as that of the module shown in FIG. 2 and connected to a gate driving circuit having the same arrangement as that of the above-described gate driving circuit, by using three kinds of resistors prepared in advance as the current interrupting resistors in the gate driving circuit.

FIG. 4 is a diagram showing the results of a short-circuit test conducted on a specimen which was prepared so as to have the same structure as that of the module 2 shown in FIG. 2 and connected to a gate driving circuit having the same arrangement as that of the above-described gate driving circuit 6, by using three kinds of resistors prepared in advance as the current interrupting resistors in the gate driving circuit. As the current interrupting resistor, three kinds with resistance values of 47 [Ω], 33 [Ω], and 22 [Ω] were prepared. The short-circuit test was conducted by directly connecting a power supply between the drain and the source of the specimen while the specimen was in an ON state.

In FIG. 4, the curves a1 and b1 show temporal changes of the short-circuit current (drain current) Isc and the gate-source voltage Vgs when the resistor with a resistance value of 47 [Ω] was used as the current interrupting resistor (corresponding to the resistor 35 shown in FIG. 3). The curves a2 and b2 show temporal changes of the short-circuit current Isc and the gate-source voltage Vgs when the resistor with a resistance value of 33 [Ω] was used as the current interrupting resistor. The curves a3 and b3 show temporal changes of the short-circuit current Isc and the gate-source voltage Vgs when the resistor with a resistance value of 22 [Ω] was used as the current interrupting resistor.

In FIG. 4, $t_0$ shows a point at which an overcurrent was detected and the gate terminal G of the specimen was grounded via the current interrupting resistor (short-circuit current interruption starting point). Regardless of the resistance value of the current interrupting resistor, when the gate terminal G of the specimen is grounded via the current interrupting resistor, the gate-source voltage Vgs and the short-circuit current (drain current) Isc decrease.

However, as can be seen from the curves a1 and b1, in the case where the resistor with a resistance value of 47 [Ω] was used as the current interrupting resistor, the short-circuit current Isc and the gate-source voltage Vgs did not converge to 0 but pulsated with a comparatively large amplitude, and thereafter, the specimen was broken. In the case where the resistor with a resistance value of 47 [Ω] was used as the current interrupting resistor, the time interval Tx1 from a time when the gate-source voltage Vgs reached 10 [V] at which the temperature characteristics of the on-resistance became negative to a time when the short-circuit current (drain current) Isc reached 2% (approximately 20 [A]) of the saturation current (approximately 100 [A]) thereof was more than 500 [nsec].

In the case where the resistor with a resistance value of 33 [Ω] was used as the current interrupting resistor, the short-circuit current Isc and the gate-source voltage Vgs converged to almost 0. The specimen was not broken. In this case, the time interval from the short-circuit current interruption starting point $t_0$ to a time when the gate-source voltage Vgs reached 10 [V] was 100 [nsec] or more, and the time interval T2 from the time when the gate-source voltage Vgs reached 10 [V] to a time when the short-circuit current Isc reached 2% of the saturation current thereof was 500 [nsec] or less.

In the case where the resistor with a resistance value of 22 [Ω] was used as the current interrupting resistor, the short-circuit current Isc and the gate-source voltage Vgs converged to almost 0. The specimen was not broken. In this case, the time interval from the short-circuit current interruption starting point $t_0$ to a time when the gate-source voltage Vgs reached 10 [V] was 100 [nsec] or more, and the time interval T3 from the time when the gate-source voltage Vgs reached 10 [V] to a time when the short-circuit current Isc reached 2% of the saturation current thereof was shorter than the time interval Tx2.

Thus, it was found that by setting the time interval from the time when the gate-source voltage Vgs reached 10 [V] at which the temperature characteristics of the on-resistance became negative to the time when the short-circuit current Isc reached 2% of the saturation current thereof to 500 [nsec] or less, the specimen was not broken. A possible reason for this is that the short-circuit current can be lowered to a small value before the short-circuit current concentrates on one of the plurality of switching elements included in the specimen (module).

In FIG. 3, the gate resistor 33 and the current interrupting resistor 35 are provided in the gate driving circuit 6, however, it is also possible that the gate resistor 33 and the current interrupting resistor 35 are provided on the module (switching device) 2 side.

Figure 6:
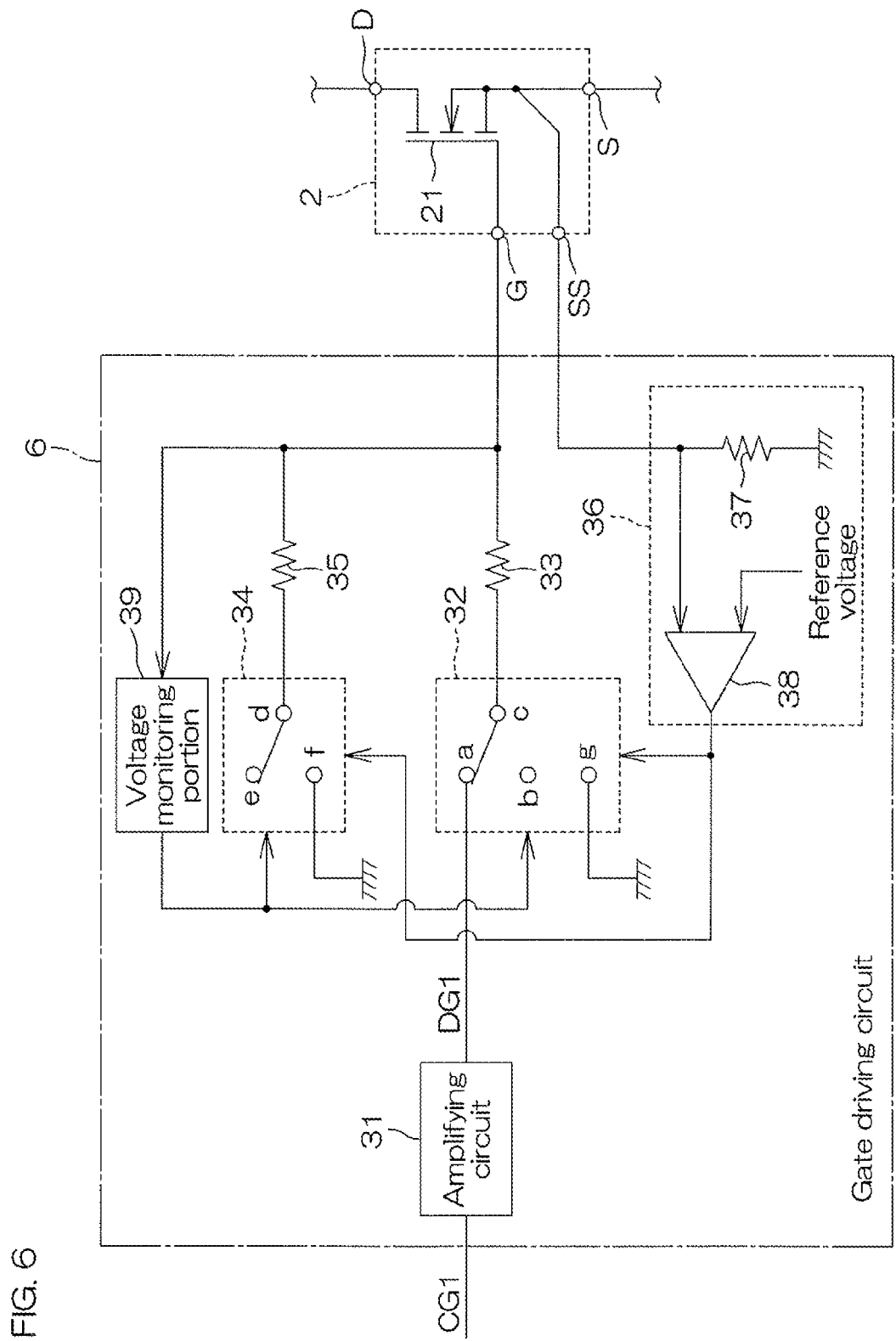
FIG. 6 is an electric circuit diagram showing another arrangement example of the gate driving circuit.

A preferred embodiment of the present invention has been described above, and further, the present invention can also be carried out in other preferred embodiments. For example, in the above-described preferred embodiment, the gate driving circuits 6 to 9 interrupt a short-circuit current by using one current interrupting resistor 35, however, it is also possible that the interrupting speed at the time of current interruption is changed in a phased manner by using a plurality of current interrupting resistors. An arrangement of the gate driving circuit in this case is described by using the first gate driving circuit 6 by way of example with reference to FIG. 6. In FIG. 6, portions corresponding to the respective portions in FIG. 3 described above are designated by the same reference signs as in FIG. 3.

In the first gate driving circuit 6 shown in FIG. 6, when detecting an overcurrent, the gate resistor 33 is used as the first current interrupting resistor, and the current interrupting resistor 35 is used as the second current interrupting resistor. The resistance value r2 of the second current interrupting resistor (current interrupting resistor 35) is set to be larger than the resistance value r1 of the first current interrupting resistor (gate resistor 33). For example, the resistance value r1 is 3.9 [Ω], and the resistance value r2 is 33 [Ω].

The first switch circuit 32 has a third input terminal g in addition to the first and second input terminals a and b. The third input terminal g is grounded. The gate driving circuit 6 further includes a voltage monitoring portion 39 that monitors the gate-source voltage Vgs of the first MOSFET 21.

In a state where no overcurrent is detected by the overcurrent detecting circuit 36 (normal state), the second switch circuit 34 selects the first output terminal e and connects the input terminal d to the first output terminal e. Accordingly, the input terminal d of the second switch circuit 34 is put into a high-impedance state. The first switch circuit 32 selects the first input terminal a and connects the first input terminal a to the output terminal c. Accordingly, the gate driving signal DG1 generated by the amplifying circuit 31 is provided to the gate of the first MOSFET 21 via the gate resistor (first current interrupting resistor) 33. By this gate driving signal DG1, driving of the first MOSFET 21 is controlled.

When an overcurrent is detected by the overcurrent detecting circuit 36, the first switch circuit 32 selects the second input terminal b and connects the output terminal c to the second input terminal b. Accordingly, the output terminal c of the first switch circuit 32 is put into a high-impedance state. The second switch circuit 34 selects the second output terminal f and connects the input terminal d to the second output terminal f. Accordingly, the input terminal d of the second switch circuit 34 is grounded.

That is, the gate of the first MOSFET 21 is grounded via the second current interrupting resistor 35. As a result, the gate-source voltage Vgs of the first MOSFET 21 is lowered. In this case, the resistance value of the second current interrupting resistor 35 is set to be larger than the resistance value of the first current interrupting resistor 33, so that the current interrupting speed is lower than in the case where the gate of the first MOSFET 21 is grounded via the first current interrupting resistor 33. When the gate-source voltage Vgs decreases, and the gate-source voltage Vgs reaches such a voltage value (in this example, 10 [V]) that the temperature characteristics of the on-resistance of the first MOSFET 21 become negative, the voltage monitoring portion 39 outputs a resistor switching signal to the first switch circuit 32 and the second switch circuit 34.

When the first switch circuit 32 receives the resistor switching signal from the voltage monitoring portion 39, the first switch circuit 32 selects the third input terminal g and connects the output terminal c to the third input terminal g. When the second switch circuit 34 receives the resistor switching signal from the voltage monitoring portion 39, the second switch circuit 34 selects the first output terminal e and connects the input terminal d to the first output terminal e. Accordingly, the gate of the first MOSFET 21 is grounded via the first current interrupting resistor 33, and the gate-source voltage Vgs is lowered. The resistance value of the first current interrupting resistor 33 is smaller than the resistance value of the second current interrupting resistor 35, so that the current interrupting speed increases.

Figure 7:
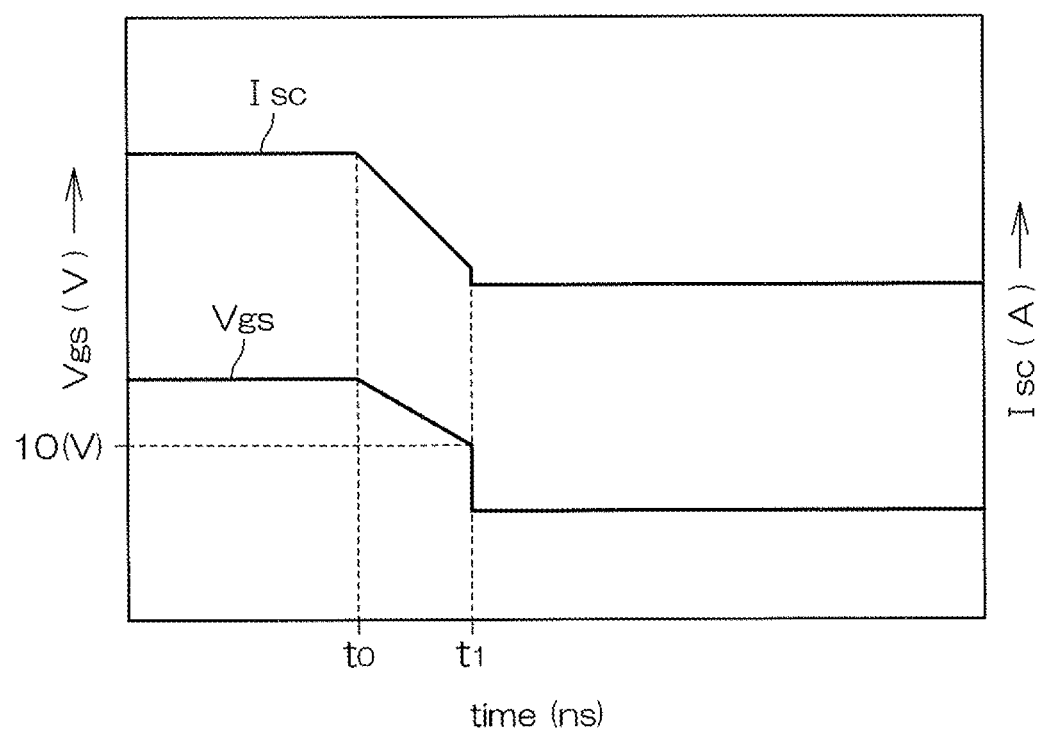
FIG. 7 is a graph schematically showing temporal changes of the short-circuit current and the gate-source voltage of the first MOSFET when the interrupting speed for a current interruption was changed in a phased manner by using a plurality of kinds of current interrupting resistors.

A graph schematically showing temporal changes of the short-circuit current (drain current) Isc and the gate-source voltage Vgs of the first MOSFET 21 at the time of a current interruption is as shown in FIG. 7. In FIG. 7, the point $t_0$ shows a point (short-circuit current interruption starting point) when an overcurrent was detected and the gate of the first MOSFET 21 was grounded via the second current interrupting resistor 35. The point $t_1$ shows a point at which the gate of the first MOSFET 21 was grounded via the first current interrupting resistor 33 based on the resistor switching signal, that is, a point at which the gate-source voltage Vgs lowered to such a value that the temperature characteristics of the on-resistance of the first MOSFET 21 became negative after starting short-circuit interruption. In this case, the time interval from the short-circuit interruption starting point $t_0$ to the point $t_1$ is 100 [nsec] or more, and the time interval from the point $t_1$ to a time when the drain current of the first MOSFET 21 becomes 2% or less of the saturation current is 500 [nsec] or less.

That is, the resistance value of the second current interrupting resistor 35 is set to such a value that the time interval from the short-circuit current interruption starting point $t_0$ to the point $t_1$ becomes 100 [nsec] or more. The resistance value of the first current interrupting resistor 33 is set to such a value that the time interval from the point $t_1$ to a time when the drain current of the first MOSFET 21 becomes 2% or less of the saturation current becomes 500 [nsec] or less.

In FIG. 6, the first current interrupting resistor (gate resistor 33) and the second current interrupting resistor 35 are provided in the gate driving circuit 6, however, it is also possible that the first current interrupting resistor (gate resistor 33) and the second current interrupting resistor 35 are provided on the module (switching device) 2 side.

The above-described preferred embodiment shows an example in which the switching elements Tr constituting the switching devices 21 to 24 are SiC-MOSFETs, however, the switching elements Tr constituting the switching devices 21 to 24 may be elements other than SiC-MOSFETs as long as the switching elements are chiefly made of SiC. For example, the switching elements Tr constituting the switching devices 21 to 24 may be SiC-bipolar transistors, SiC-JFETs, or SiC-IGBTs, etc. In the case where the switching elements Tr are SiC-IGBTs, the collectors of the SiC-IGBTs correspond to the drains of the above-described SiC-MOSFETs, and the emitters of the SiC-IGBTs correspond to the sources of the above-described SiC-MOSFETs.

In the above-described preferred embodiment, a case where the present invention is applied to an inverter circuit is described, however, the present invention is also applicable to electronic circuits such as converter circuits, etc., other than inverter circuits.

Although the preferred embodiments of the present invention have been described in detail as above, these are merely specific examples used to clarify the technical content of the present invention, and the present invention should not be understood as being limited to these examples, and the scope of the present invention is to be determined solely by the appended claims.

The present application corresponds to Japanese Patent Application No. 2012-240564 filed in the Japan Patent Office on Oct. 31, 2012, and the entire disclosure of the application is incorporated herein by reference.

REFERENCE SIGNS LIST

1 Inverter circuit
2 to 5 Module (switching device)

6 to 9 Gate driving circuit
10 Control portion
11 Power supply
12 Load
21 to 24 MOSFET
31 Amplifying circuit
32 First switch circuit
33 Gate resistor
34 First switch circuit
35 Current interrupting resistor
36 Overcurrent detecting circuit
39 Voltage monitoring portion

The invention claimed is:

1. An electronic circuit comprising:
a switching device including a plurality of switching elements that are connected in parallel and chiefly made of SiC;
an overcurrent detecting circuit to detect that an overcurrent is flowing in the switching device; and
an overcurrent protecting circuit to interrupt a current flowing in the switching device when an overcurrent is detected by the overcurrent detecting circuit, wherein
the overcurrent protecting circuit is arranged such that, at the time of a current interruption, a time interval from a time when the gate-source voltage or gate-emitter voltage of the switching device lowers to such a voltage that the temperature characteristics of the on-resistance of the switching device become negative to a time when the drain current or collector current of the switching device reaches 2% of the saturation current thereof is 500 [nsec] or less.

2. The electronic circuit according to claim 1, wherein the overcurrent protecting circuit is arranged such that, at the time of a current interruption, a time interval from a time when a current interrupting operation is started to a point at which the gate-source voltage or gate-emitter voltage of the switching device lowers to such a voltage that the temperature characteristics of the on-resistance of the switching device become negative is 100 [nsec] or more, and a time interval from the point to a time when the drain current or collector current of the switching device reaches 2% of the saturation current thereof is 500 [nsec] or less.

3. The electronic circuit according to claim 1, wherein the overcurrent protecting circuit includes
a current interrupting resistor, and
a circuit that grounds the gate terminal of the switching device via the current interrupting resistor when an overcurrent is detected by the overcurrent detecting circuit, and
the resistance value of the current interrupting resistor is set so that a time interval from a time when the gate-source voltage or gate-emitter voltage of the switching device lowers to such a voltage that the temperature characteristics of the on-resistance of the switching device become negative to a time when the drain current or collector current of the switching device reaches 2% of the saturation current thereof is 500 [nsec] or less.

4. The electronic circuit according to claim 1, wherein the overcurrent protecting circuit includes
a current interrupting resistor, and
a circuit that grounds the gate terminal of the switching device via the current interrupting resistor when an overcurrent is detected by the overcurrent detecting circuit, and
the resistance value of the current interrupting resistor is set so that a time interval from a time when a current interrupting operation is started to a point at which the gate-source voltage or gate-emitter voltage of the switching device lowers to such a voltage that the temperature characteristics of the on-resistance of the switching device become negative is 100 [nsec] or more, and a time interval from the point to a time when the drain current or collector current of the switching device reaches 2% of the saturation current thereof is 500 [nsec] or less.

5. The electronic circuit according to claim 1, wherein the overcurrent protecting circuit includes
a first current interrupting resistor,
a second current interrupting resistor whose resistance value is larger than the resistance value of the first current interrupting resistor, and
a circuit that grounds the gate terminal of the switching device via the second current interrupting resistor when an overcurrent is detected by the overcurrent detecting circuit, and grounds the gate terminal of the switching device via the first current interrupting resistor when the gate-source voltage or gate-emitter voltage of the switching device lowers to such a voltage that the temperature characteristics of the on-resistance of the switching device become negative, and
the resistance value of the first current interrupting resistor is set so that a time interval from a time when the gate-source voltage or gate-emitter voltage of the switching device lowers to such a voltage that the temperature characteristics of the on-resistance of the switching device become negative to a time when the drain current or collector current of the switching device reaches 2% of the saturation current thereof is 500 [nsec] or less.

6. The electronic circuit according to claim 2, wherein the overcurrent protecting circuit includes
a first current interrupting resistor,
a second current interrupting resistor whose resistance value is larger than the resistance value of the first current interrupting resistor, and
a circuit that grounds the gate terminal of the switching device via the second current interrupting resistor when an overcurrent is detected by the overcurrent detecting circuit, and grounds the gate terminal of the switching device via the first current interrupting resistor when the gate-source voltage or gate-emitter voltage lowers to such a voltage that the temperature characteristics of the on-resistance of the switching device become negative, and
the resistance value of the second current interrupting resistor is set so that a time interval from a time when a current interrupting operation is started to a point at which the gate-source voltage or gate-emitter voltage of the switching device lowers to such a voltage that the temperature characteristics of the on-resistance of the switching device become negative is 100 [nsec] or more, and
the resistance value of the first current interrupting resistor is set so that a time interval from a point at which the gate-source voltage or gate-emitter voltage of the switching device lowers to such a voltage that the temperature characteristics of the on-resistance of the switching device become negative to a time when the drain current or collector current of the switching device reaches 2% of the saturation current thereof is 500 [nsec] or less.

7. The electronic circuit according to claim 1, wherein the switching elements are ones arbitrarily selected from among MOSFETs, bipolar transistors, JFETs, and IGBTs that are chiefly made of SiC.

* * * * *